US012744359B2

(12) United States Patent
Cheung et al.

(10) Patent No.: US 12,744,359 B2
(45) Date of Patent: Sep. 22, 2026

(54) ELECTRODE BRIDGING IN AN EMITTER ASSEMBLY

(71) Applicant: Lumentum Operations LLC, San Jose, CA (US)

(72) Inventors: Siu Kwan Cheung, San Jose, CA (US); Lijun Zhu, Dublin, CA (US); Qianhuan Yu, Sunnyvale, CA (US); Benjamin Kesler, Livemore, CA (US); Wei Shi, San Jose, CA (US); Joseph Leigh, Santa Clara, CA (US)

(73) Assignee: Lumentum Operations LLC, San Jose, CA (US)

(*) Notice: Subject to any disclaimer, the term of this patent is extended or adjusted under 35 U.S.C. 154(b) by 561 days.

(21) Appl. No.: 18/362,569

(22) Filed: Jul. 31, 2023

(65) Prior Publication Data

US 2024/0396297 A1 Nov. 28, 2024

Related U.S. Application Data

(60) Provisional application No. 63/504,607, filed on May 26, 2023.

(51) Int. Cl.
*H01S 5/042* (2006.01)
*H01S 5/42* (2006.01)

(52) U.S. Cl.
CPC .......... *H01S 5/04256* (2019.08); *H01S 5/423* (2013.01)

(58) Field of Classification Search
None
See application file for complete search history.

(56) References Cited

U.S. PATENT DOCUMENTS 10,833,483 B2 * 11/2020 Yuen .................... H01S 5/423
2003/0038344 A1 * 2/2003 Palmer ................ H05K 3/0055 257/E21.597
2011/0165707 A1 * 7/2011 Lott .................... H01S 5/0217 257/E33.056
2014/0321817 A1 * 10/2014 Wang .................. H01S 5/0234 385/89
2015/0110496 A1 * 4/2015 DeCusatis ............. G02B 6/43 398/116
2019/0036308 A1 * 1/2019 Carson ................ H01S 5/0237
2020/0194972 A1 * 6/2020 Barve ................. H01S 5/18311
(Continued)

FOREIGN PATENT DOCUMENTS

CN 119029670 A * 11/2024 ......... H01S 5/04254
WO WO-2021068132 A1 * 4/2021 ............ H01S 5/423

*Primary Examiner* — Deandra M Hughes
(74) *Attorney, Agent, or Firm* — Harrity & Harrity, LLP

(57) ABSTRACT

In some implementations, an emitter assembly includes a vertical cavity surface emitting laser (VCSEL) device. The VCSEL device may include a substrate. The VCSEL device may include a plurality of VCSELs on the substrate. The VCSEL device may include at least one anode layer on the substrate and electrically connected to the plurality of VCSELs. The VCSEL device may include a cathode electrode over at least a portion of multiple VCSELs, of the plurality of VCSELs, and electrically connected to the multiple VCSELs. The cathode electrode may include multiple cathode electrode fingers. The emitter assembly may include a bridge element that electrically connects a first finger of the multiple cathode electrode fingers and a second finger of the multiple cathode electrode fingers.

20 Claims, 10 Drawing Sheets

(56) References Cited

U.S. PATENT DOCUMENTS

| | | | | |
|---|---|---|---|---|
| 2020/0313401 | A1* | 10/2020 | Yuen | H01S 5/02345 |
| 2020/0321754 | A1* | 10/2020 | Hegblom | H01S 5/4025 |
| 2023/0187905 | A1* | 6/2023 | Hegblom | H01S 5/0208<br>372/46.013 |
| 2023/0387232 | A1* | 11/2023 | Zhang | H10D 64/519 |
| 2024/0195153 | A1* | 6/2024 | Shi | H01S 5/0234 |
| 2024/0348008 | A1* | 10/2024 | Cheung | H01S 5/18311 |
| 2024/0396297 | A1* | 11/2024 | Cheung | H01S 5/423 |
| 2026/0003041 | A1* | 1/2026 | Kanaya | G01S 7/4815 |

* cited by examiner 100
102
104
106
108
110
112
X 150
106
104
108
110
112
114
116
118
120
122
124
126
128
$d_t$
$d_o$
~10um
X 230
240
241b
241a
244
244b
242
244b
244b
240b
241
240a
244
242
242
244a
242

ELECTRODE BRIDGING IN AN EMITTER ASSEMBLY

CROSS-REFERENCE TO RELATED APPLICATION

This Patent Application claims priority to U.S. Provisional Patent Application No. 63/504,607, filed on May 26, 2023, and entitled "REDISTRIBUTION LAYER INTERFACE CONFIGURATIONS FOR BACK-EMITTING VERTICAL CAVITY SURFACE EMITTING LASER ARRAYS." The disclosure of the prior Application is considered part of and is incorporated by reference into this Patent Application.

TECHNICAL FIELD

The present disclosure relates generally to vertical cavity surface emitting lasers (VCSELs) and to electrode bridging in an emitter assembly.

BACKGROUND

A vertical-emitting laser device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, an emitter assembly includes a carrier including a carrier substrate. The emitter assembly may include a VCSEL device on the carrier. The VCSEL device may include a substrate. The VCSEL device may include a plurality of VCSELs on the substrate. The VCSEL device may include at least one anode layer on the substrate and electrically connected to the plurality of VCSELs. The VCSEL device may include one or more anode interconnects that electrically connect the at least one anode layer and the carrier. The VCSEL device may include a cathode electrode over at least a portion of multiple VCSELs, of the plurality of VCSELs, and electrically connected to the multiple VCSELs. The cathode electrode may include multiple cathode electrode fingers, and one or more cathode interconnects that electrically connect the cathode electrode and the carrier. The one or more cathode interconnects may include one or more first interconnects connected to a first finger of the multiple cathode electrode fingers of the cathode electrode and one or more second interconnects connected to a second finger of the multiple cathode electrode fingers of the cathode electrode. The emitter assembly may include one or more redistribution layers including one or more traces. The one or more first interconnects may be bridged to the one or more second interconnects by the one or more traces of the one or more redistribution layers.

In some implementations, an emitter assembly includes a carrier including a carrier substrate. The emitter assembly may include a VCSEL device on the carrier. The VCSEL device may include a substrate. The VCSEL device may include a plurality of VCSELs on the substrate. The VCSEL device may include at least one anode layer on the substrate and electrically connected to the plurality of VCSELs. The VCSEL device may include a cathode electrode over at least a portion of multiple VCSELs, of the plurality of VCSELs, and electrically connected to the multiple VCSELs. The cathode electrode may include multiple cathode electrode fingers. The emitter assembly may include a bridge element that electrically connects a first finger of the multiple cathode electrode fingers and a second finger of the multiple cathode electrode fingers.

In some implementations, an emitter assembly includes a VCSEL device. The VCSEL device may include a substrate. The VCSEL device may include a plurality of VCSELs on the substrate. The VCSEL device may include at least one anode layer on the substrate and electrically connected to the plurality of VCSELs. The VCSEL device may include a cathode electrode over at least a portion of multiple VCSELs, of the plurality of VCSELs, and electrically connected to the multiple VCSELs. The cathode electrode may include multiple cathode electrode fingers. The emitter assembly may include a bridge element that electrically connects a first finger of the multiple cathode electrode fingers and a second finger of the multiple cathode electrode fingers.

DETAILED DESCRIPTION

Figures 1A, 1B:
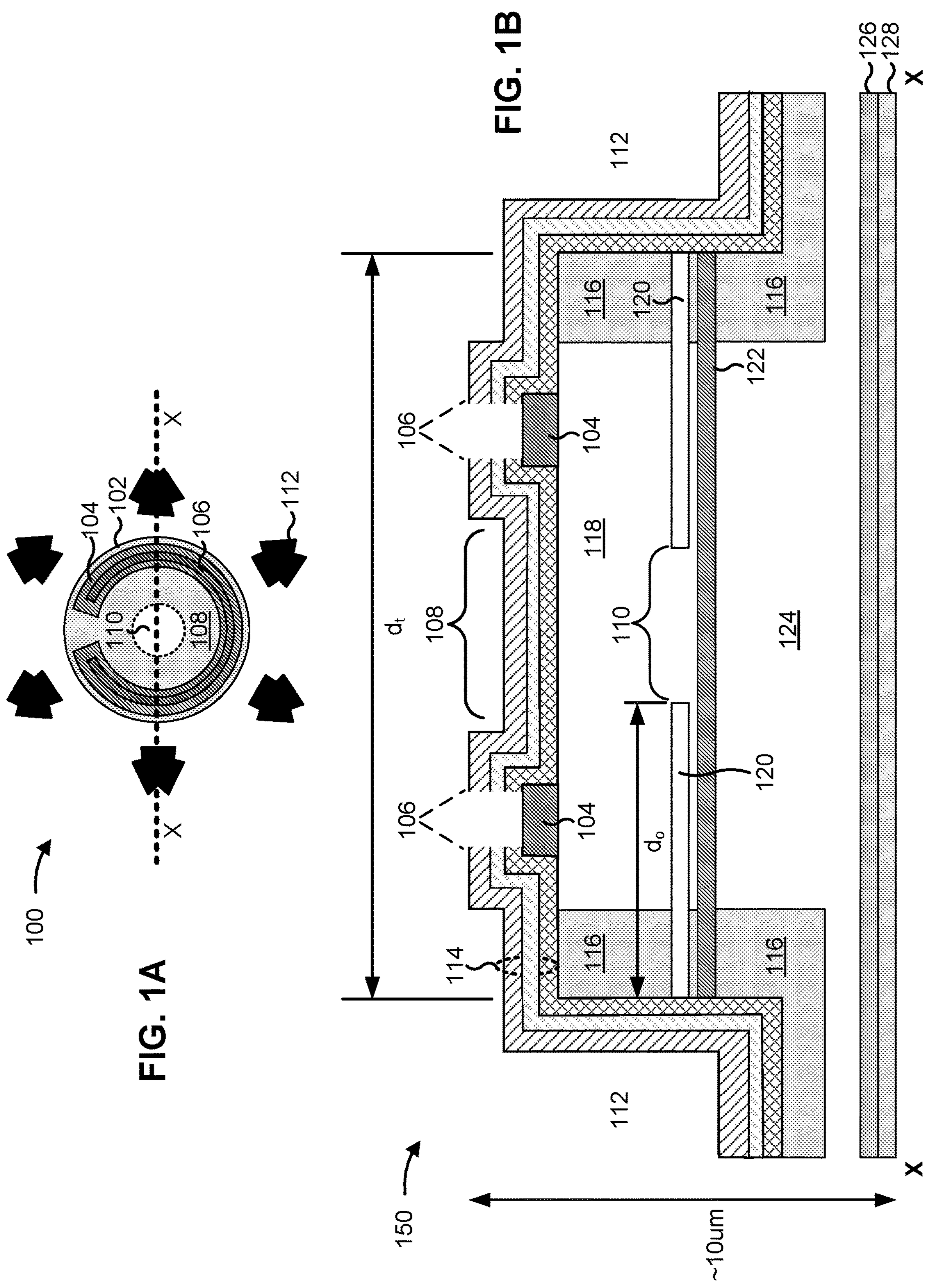
FIGS. 1A and 1B are diagrams illustrating a top view of an example of a conventional emitter and a cross-sectional view of the example emitter along line X-X, respectively.

The following detailed description of example implementations refers to the accompanying drawings. The same reference numbers in different drawings may identify the same or similar elements.

A bottom-emitting VCSEL device (e.g., a VCSEL chip) may be flip chip mounted on an integrated circuit (IC) driver chip (which may be referred to as a VCSEL-on-driver (VoD) configuration). VCSELs of the VCSEL device may be turned on and off via the driver chip. A decoupling capacitor may also be included for the driver chip and electrically connected to the VCSEL device. In this configuration, current is discharged from the decoupling capacitor to an anode electrode of the VCSEL device, through one or more VCSELs of the VCSEL device, and to a cathode electrode of the VCSEL device.

The cathode electrode may be connected to one or more rows of VCSELs of the VCSEL device. Thus, the cathode electrode may extend across a length of the VCSEL device, thereby providing a relatively long current path through the cathode electrode. As a result, some VCSELs connected to the cathode electrode may experience optical output delays and/or have optical power differences relative to other VCSELs connected to the cathode electrode. Furthermore, the long current path through the cathode electrode may increase the rise times of optical outputs of the VCSELs of the VCSEL device.

Some implementations described herein enable a more balanced power profile for VCSELs of a VCSEL device. In some implementations, an emitter assembly may include a VCSEL device having an array of VCSELs that are organized into multiple channels by a plurality of cathode electrodes. A cathode electrode may have multiple (e.g., parallel) electrode fingers. In some examples, the electrode fingers of multiple cathode electrodes may be arranged interdigitally. A plurality of cathode interconnects may connect the cathode electrodes to a carrier (e.g., that includes a driver for the VCSEL device) of the emitter assembly. For example, a first set of cathode interconnects may connect a first electrode finger of a cathode electrode and the carrier, and a second set of cathode interconnects may connect a second electrode finger of the cathode electrode and the carrier. Moreover, the emitter assembly may include (e.g., in one or more redistribution layers of the carrier and/or of the VCSEL device) one or more traces (e.g., jumpers) that bridge the first set of cathode interconnects with the second set of cathode interconnects. The traces enable current to flow through the cathode electrode, and the VCSELs connected thereto, more evenly. In this way, the VCSELs may experience less optical output delay, may have more uniform optical power outputs, and/or may have reduced rise times of optical outputs.

In some implementations, the VCSEL device may include one or more conductive pads that electrically connect a first electrode finger and a second electrode finger of a cathode electrode. For example, a conductive pad may bridge the first electrode finger and the second electrode finger, and may be electrically isolated from (e.g., by an isolation layer beneath the conductive pad) any cathode electrode between the first electrode finger and the second electrode finger. A cathode interconnect may be electrically connected to the conductive pad. Moreover, this cathode interconnect may be larger than a conventional interconnect. For example, a width of the cathode interconnect may be greater than widths of the first electrode finger or the second electrode finger. By using conductive pads that bridge the first electrode finger and the second electrode finger, the VCSELs may experience less optical output delay, may have more uniform optical power outputs, and/or may have reduced rise times of optical outputs, as described above. Furthermore, using the larger cathode interconnects improves a reliability of an electrical connection between the VCSEL device and the carrier.

FIGS. 1A and 1B are diagrams illustrating a top view of an example of a conventional emitter 100 and a cross-sectional view 150 of the example emitter 100 along line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer, a passivation layer, or a dielectric mirror composed of multiple layers) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium gray area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112 (e.g., of the same size or of different sizes), in practice, other configurations may be used, such as a compact emitter that includes five trenches 112, seven trenches 112, or another quantity of trenches. In some implementations, trenches 112 may encircle emitter 100 to form a mesa structure $d_t$ (shown in FIG. 1B). As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are contemplated. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, emitter 100 may have, for example, a total height that is approximately 10 micrometers (μm).

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer, and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor, may provide a non-rectifying electrical junction, and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B are provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100, and any layer may comprise more than one layer. For example, in a bottom-emitting VCSEL, cathode layer 128 may be on a top side of emitter 100 over, and electrically connected to, top mirror 118, thereby eliminating optical aperture 108. Cathode layer 128 may be underneath protective layer 114, on top of protective layer 114 (e.g., where cathode layer 128 is electrically connected to top mirror 118 through vias 106), or protective layer 114 may be eliminated. Furthermore, the anode ohmic metal layer 104 may be relocated underneath bottom mirror 124 so as to allow current to flow from ohmic metal layer 104 to cathode layer 128 through active region 122 and to allow light emission through substrate 126. Ohmic metal layer 104 and cathode layer 128 may be electrically isolated from each other by an isolation material (e.g., a dielectric material).

Figure 2:
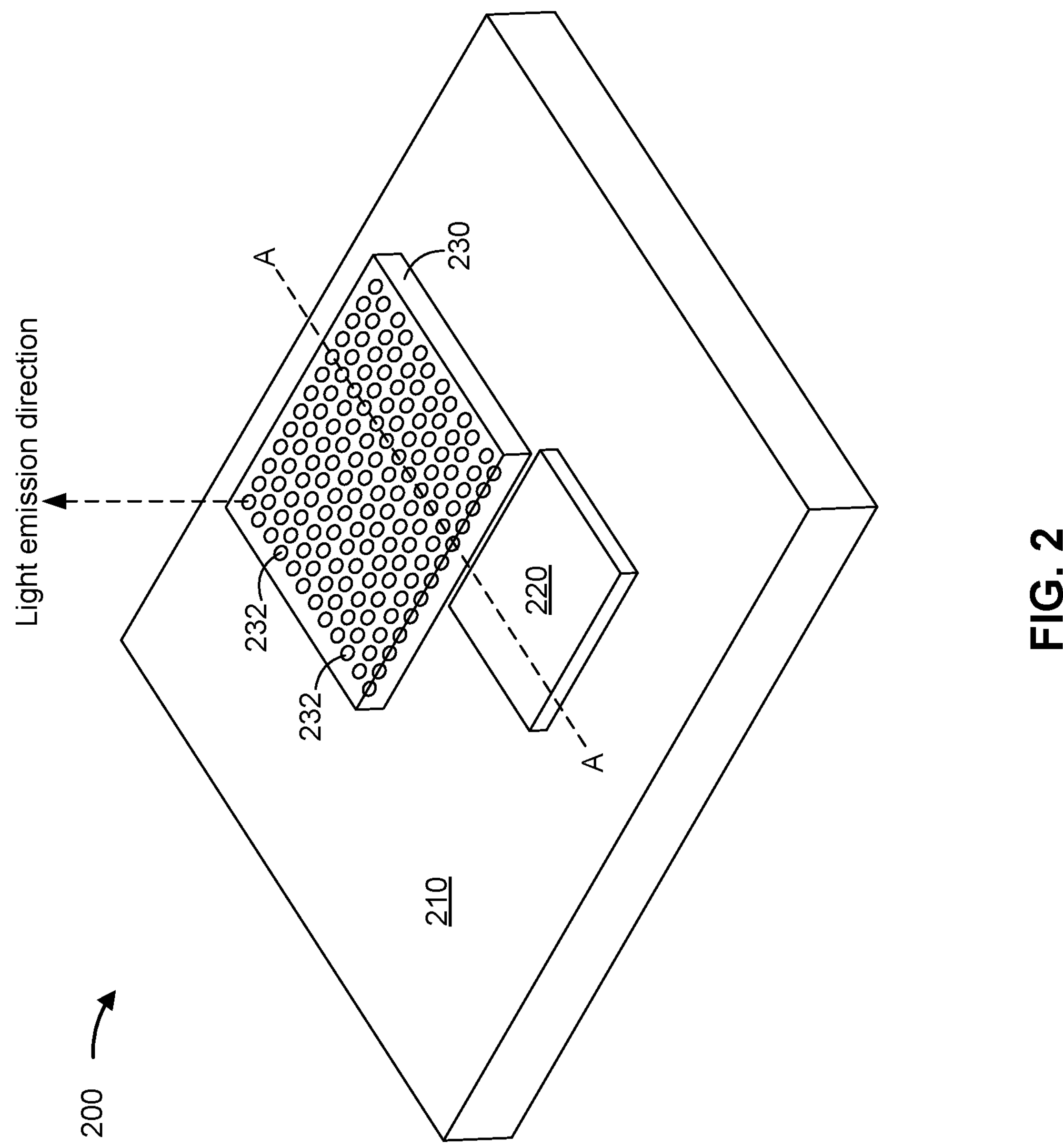
FIG. 2 is a diagram illustrating a perspective view of an example emitter assembly.

FIG. 2 is a diagram illustrating a perspective view of an example emitter assembly 200. As shown, the emitter assembly 200 includes a carrier 210, a decoupling capacitor 220 (e.g., one or more decoupling capacitors 220), and a VCSEL device 230. The carrier 210 may support the VCSEL device 230 and/or the decoupling capacitor 220. The decoupling capacitor 220 may be connected to the carrier 210. For example, the decoupling capacitor 220 may be disposed on the carrier 210 or integrated into the carrier 210. As an example, the decoupling capacitor 220 may be in a flip chip configuration on the carrier 210.

The VCSEL device 230 (e.g., a VCSEL chip) may be disposed on the carrier 210. For example, the VCSEL device 230 may be in a flip chip configuration on the carrier 210. In some implementations, the emitter assembly 200 may omit the decoupling capacitor 220, and the VCSEL device 230 may be connected to a voltage source. The VCSEL device 230 may include a plurality of VCSELs 232 (e.g., an n×m VCSEL array, where n and m are integers greater than one). The VCSEL device 230 may be configured such that VCSELs 232 may be controlled (e.g., driven) individually, as rows, or as clusters. In some implementations, the VCSEL device 230 may be configured for driving multiple VCSELs 232 concurrently at high speed.

As described herein, the VCSEL device 230 may be a part of the emitter assembly 200. In some implementations, the VCSEL device 230 may be a component separate from the emitter assembly 200 (e.g., the VCSEL device 230 may be a standalone device).

As indicated above, FIG. 2 is provided as an example. Other examples may differ from what is described with regard to FIG. 2.

Figure 3A:
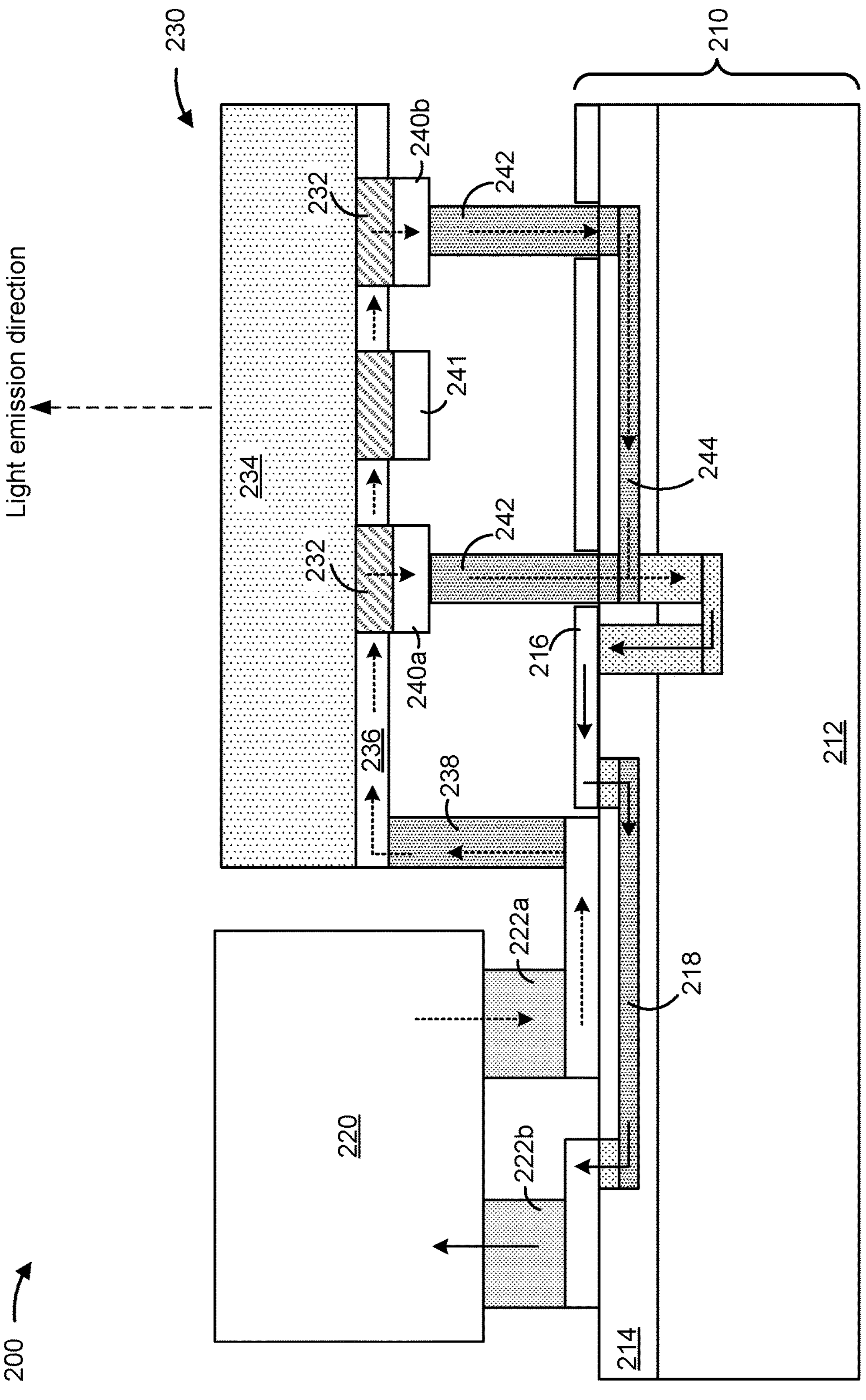
FIGS. 3A-3C are diagrams illustrating simplified cross-sectional views of the example emitter assembly of FIG. 2 taken along line A-A.

FIG. 3A is a diagram illustrating a simplified cross-sectional view of the example emitter assembly 200 of FIG. 2 taken along line A-A.

As shown, the carrier 210 may include a carrier substrate 212. The carrier substrate 212 may include an IC chip, such as a driver chip configured to drive the VCSEL device 230. Alternatively, the carrier substrate 212 may include a circuit board (e.g., a printed circuit board) or another type of substrate. The emitter assembly 200 may include one or more redistribution layers 214. The one or more redistribution layers 214 may be on the carrier substrate 212, as shown in FIG. 3A, and/or may be integrated in the VCSEL device 230, as described in connection with FIG. 3B or FIG. 3C (e.g., the one or more redistribution layers 214 may be on a combination of the carrier substrate 212 and the VCSEL device 230). The one or more redistribution layers 214 may include one or more layers (e.g., of traces and vias) configured to provide interconnection between the carrier substrate 212 and the VCSEL device 230. For example, the redistribution layer(s) 214 may be configured to redistribute electrical connections from the VCSEL device 230 to the carrier 210.

The carrier 210 may include a ground layer 216 configured to return current that has flowed through the VCSEL device 230 to the decoupling capacitor 220. The ground layer 216 may be electrically connected to a ground path 218 of the carrier 210. The ground layer 216 may include a conductive layer, such as a metal layer (e.g., a copper layer, a gold layer, or the like). In some implementations, the ground layer 216 may be disposed on the redistribution layer(s) 214.

The decoupling capacitor 220 may include a set of electrical contacts 222*a*, 222*b*. The decoupling capacitor 220 (e.g., a ground contact 222*b* of the decoupling capacitor 220) may be electrically connected to the ground path 218.

The VCSEL device 230 may be electrically connected to the ground layer 216 and to the decoupling capacitor 220. The VCSEL device 230 may include a substrate 234 and a plurality of VCSELs 232 disposed on the substrate 234. The VCSELs 232 may be configured as mesa structures or as planar structures. As described elsewhere herein, a VCSEL 232 may include a bottom mirror (e.g., a bottom DBR), an active region, and a top mirror (e.g., a top DBR), among other layers. The VCSELs 232 may be in a bottom-emitting (or "back-emitting") configuration (e.g., a light emission direction of the VCSELs 232 may be through the substrate 234). However, in some implementations, the plurality of VCSELs 232 may be in a top-emitting configuration.

The VCSEL device 230 may include a conductive anode layer 236. The anode layer 236 may include a continuous layer (e.g., a plate) that runs along a surface of the substrate 234 having a plurality of openings that surround each VCSEL 232 to define apertures for each VCSEL 232. Accordingly, anodes of all of the VCSELs 232 may be tied together by the anode layer 236. For example, the anode layer 236 may be electrically connected to respective bottom mirrors of each of the VCSELs 232 (e.g., via ohmic contacts). In some implementations, other configurations of the anode layer 236 may be utilized. For example, the VCSEL device 230 may include multiple discrete anode layers (e.g., anode electrodes), and each anode layer may connect to a respective set of VCSELs 232 (e.g., one or more VCSELs 232). The anode layer 236 may include a metal layer, as described herein. In some implementations, a conductive semiconductor layer (not shown) may be disposed on the substrate 234 between the anode layer 236 and the VCSELs 232. Thus, the anode layer 236 may be electrically connected to the VCSELs 232 via the conductive semiconductor layer. The conductive semiconductor layer may include a doped semiconductor material, such as n-GaAs or p-GasAs.

The VCSEL device 230 may have an electrical connection to the carrier 210 via a plurality of interconnects, such as solder balls, conductive bumps (e.g., copper bumps), conductive pillars (e.g., copper pillars), or the like. For example, the interconnects may include one or more (e.g., a plurality of) anode interconnects 238 electrically connected to the anode layer 236. In some implementations, the anode interconnects 238 may be positioned at one or more edges of the VCSEL device 230 (e.g., electrically connected to contact pads at one or more edges of the anode layer 236). The anode interconnects 238 may extend from the VCSEL device 230 to the carrier 210 and/or may extend from the carrier 210 to the VCSEL device 230 (e.g., to contact pads on the VCSEL device 230).

The VCSEL device 230 may include a cathode electrode 240 (shown as 240*a* and 240*b*). The cathode electrode 240 may be over at least a portion of one or more VCSELs 232 and may be electrically connected to the one or more VCSELs 232. As an example, the cathode electrode 240 may be electrically connected to respective top mirrors of each of the one or more VCSELs 232 (e.g., via ohmic contacts). The anode layer 236 and a cathode electrode 240 may be electrically separated (e.g., by a dielectric material), except when a VCSEL 232 is turned on. Accordingly, electrical current may flow from the anode layer 236, through the one or more VCSELs 232, to the cathode electrode 240. In some implementations, as shown, the cathode electrode 240 may fully cover top surfaces of the one or more VCSELs 232, which provides a bottom-emitting configuration for the one or more VCSELs 232.

The cathode electrode 240 may be electrically connected to a single VCSEL 232, a row of VCSELs 232, multiple rows of VCSELs 232 (as shown), a cluster of VCSELs 232, or all of the VCSELs 232. In some implementations, the VCSEL device 230 may include a plurality of cathode electrodes. Each cathode electrode may be electrically connected to a respective set of VCSELs 232 (e.g., one or more VCSELs 232), thereby enabling control of the set of VCSELs 232 independently from other sets of VCSELs 232. As an example, the VCSEL device 230 may include multiple cathode electrodes, where VCSELs that share a cathode electrode may be referred to as a "sub-array" or a "channel."

Figure 4:
FIG. 4 is a diagram illustrating an example VCSEL device.
Figure 4:
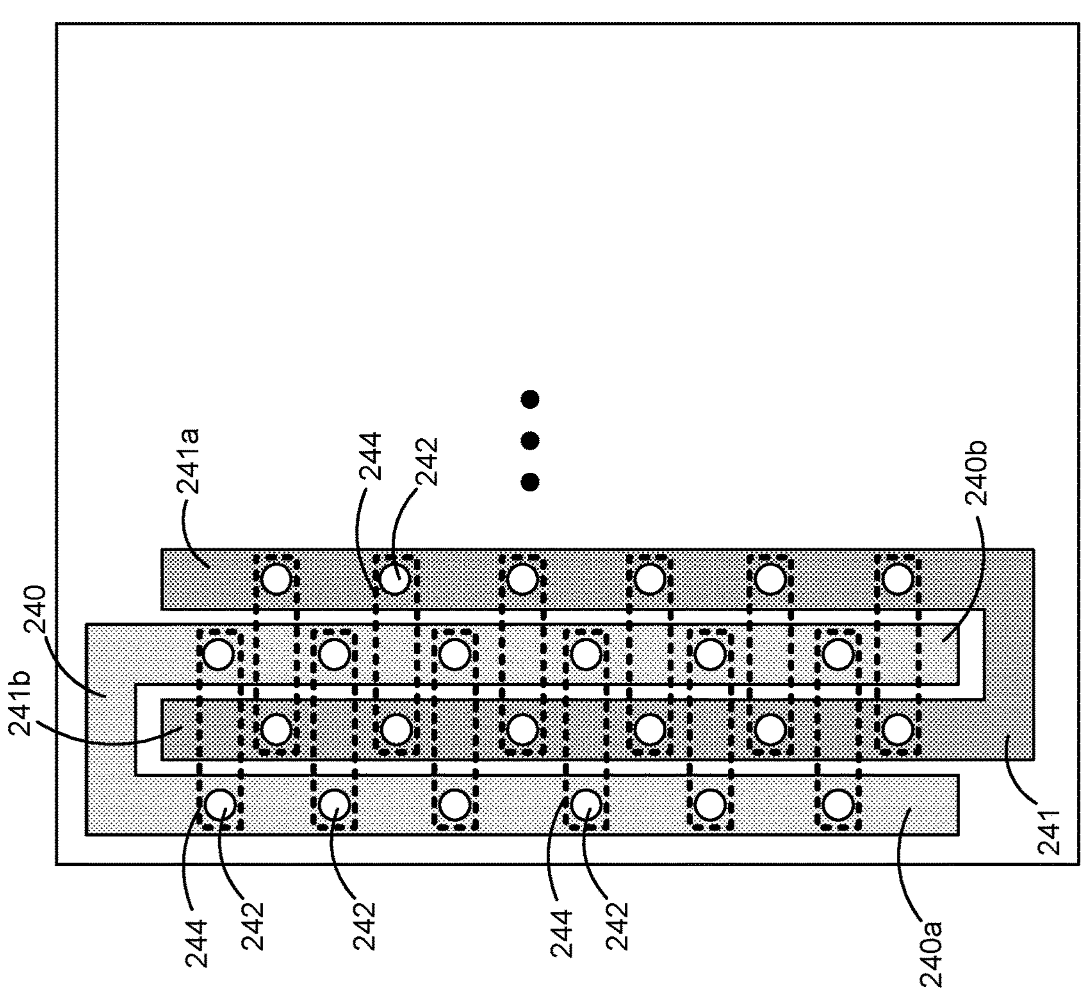
Figure 5:
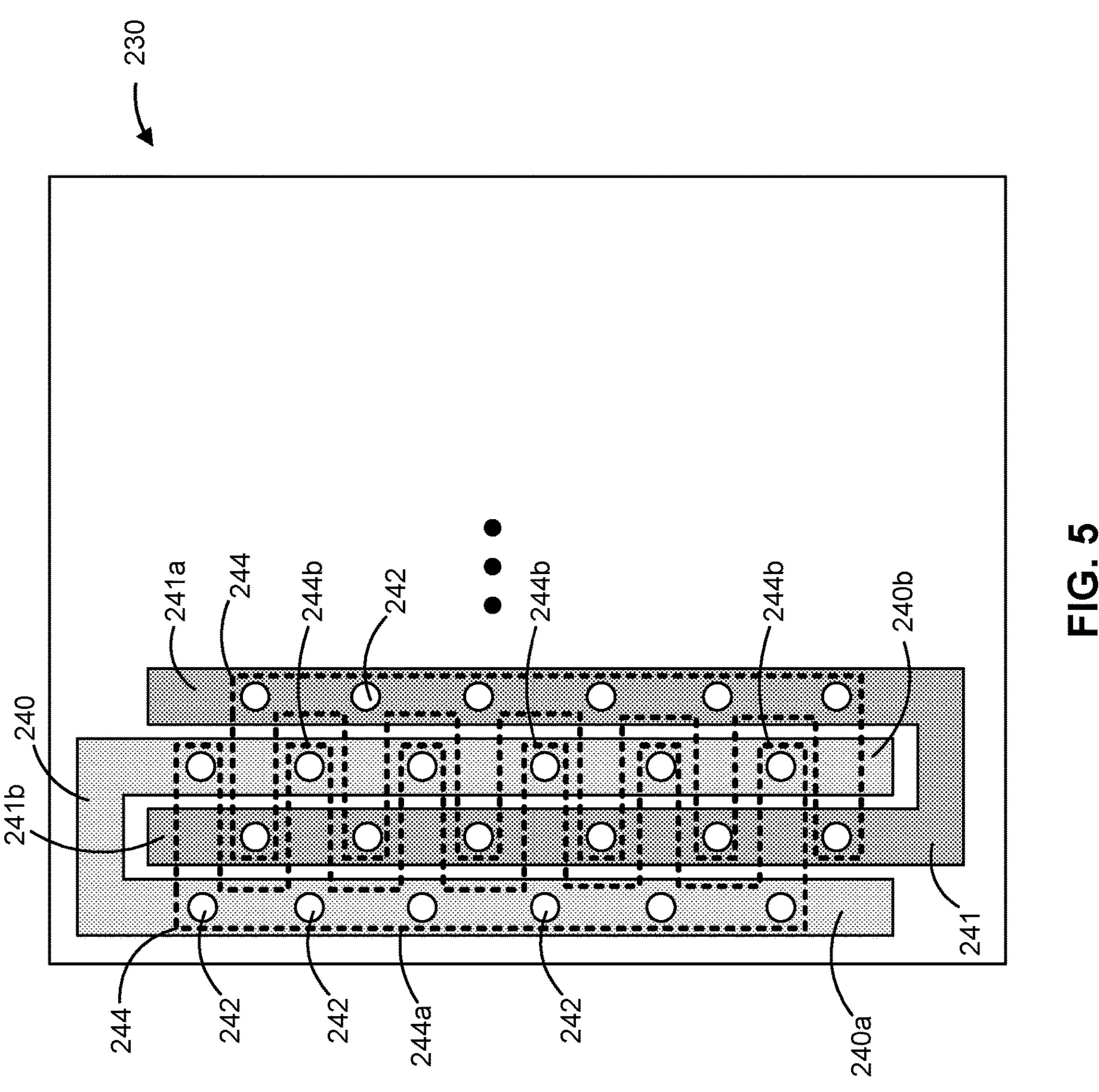
FIG. 5 is a diagram illustrating an example VCSEL device.
Figure 6:
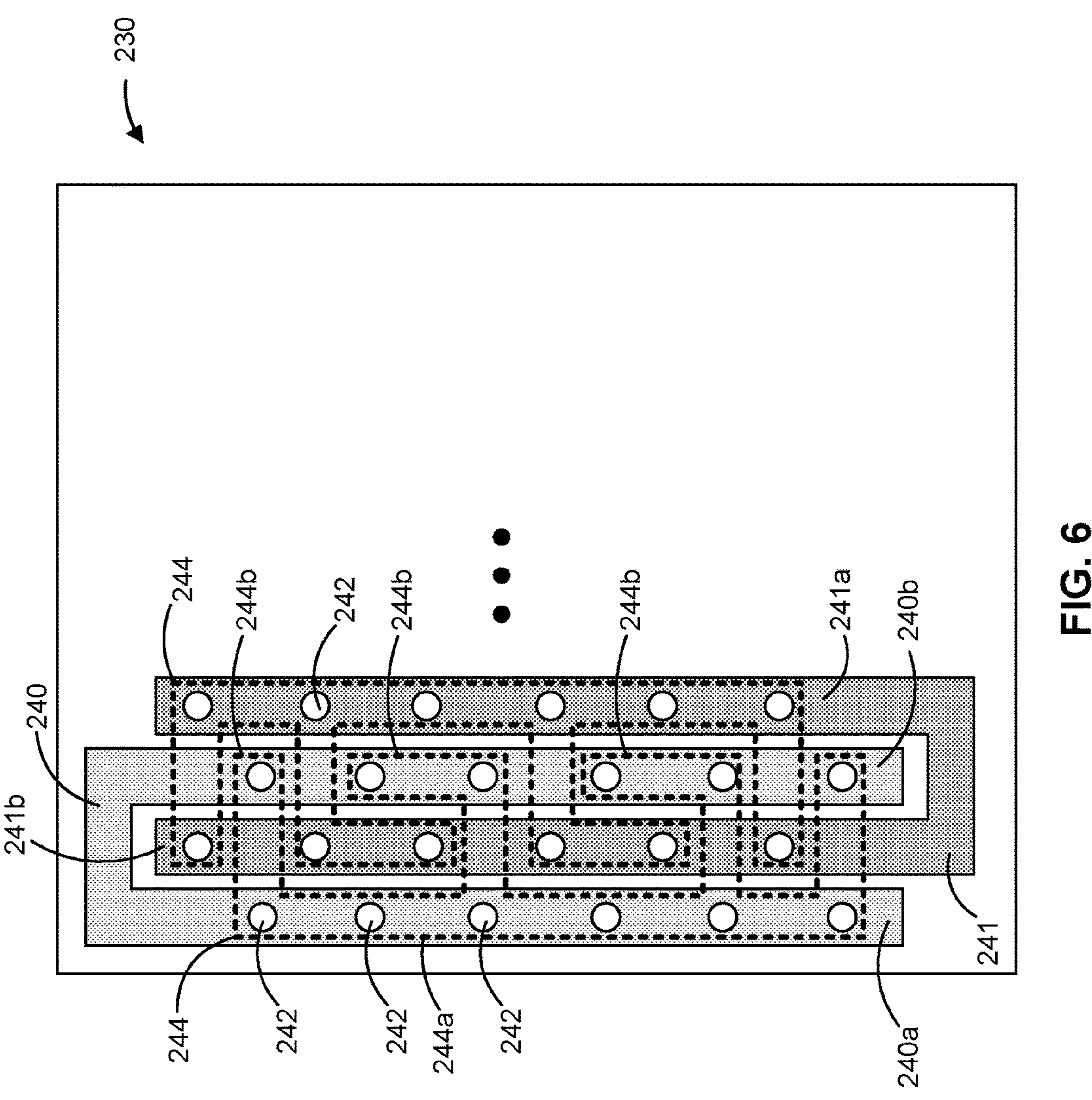
FIG. 6 is a diagram illustrating an example VCSEL device.

The cathode electrode 240 may be a comb-type electrode. In some implementations, the cathode electrode 240 may include multiple electrode fingers, shown as a first electrode finger 240*a* and a second electrode finger 240*b*. The electrode fingers 240*a*, 240*b* may be arranged interdigitally with electrode fingers (shown as a single electrode finger in FIG. 3A for simplicity) of an additional cathode electrode 241 of the VCSEL device 230 (as illustrated in FIGS. 4-6). In some implementations, a cathode electrode 240 or 241 may include more than two electrode fingers. A cathode electrode may extend continuously from a first electrode finger to a second electrode finger, or a cathode electrode may include one or more discontinuities between a first electrode finger and a second electrode finger (e.g., the cathode electrode may include a set of parallel electrodes). In the latter case, the first electrode finger and the second electrode finger may be considered as part of the same cathode electrode based on an electrical connection between the first electrode finger and the second electrode finger (e.g., using one or more bridge elements, as described herein). In other words, a cathode electrode may include any electrode sections (whether continuous with each other or having discontinuities therebetween) that define a single channel of the VCSEL device 230. In some implementations, the cathode electrodes 240, 241 may have a non-interdigitated configuration.

The interconnects that electrically connect the carrier 210 and the VCSEL device 230 may also include one or more (e.g., a plurality of) cathode interconnects 242 electrically connected to cathode electrodes (e.g., cathode electrode 240 and cathode electrode 241) of the VCSEL device 230. In some implementations, the cathode interconnects 242 may be arranged in rows, each row corresponding to a row of VCSELs 232 that share a common cathode electrode. In some implementations, the cathode interconnects 242 may be located at each of the VCSELs 232 (e.g., a quantity of cathode interconnects 242 may equal a quantity of VCSELs 232) or at a subset of the VCSELs 232 (e.g., a quantity of cathode interconnects 242 may be less than a quantity of VCSELs 232). The cathode interconnects 242 may extend from the VCSEL device 230 to the carrier 210 and/or may extend from the carrier 210 to the VCSEL device 230 (e.g., to contact pads on the VCSEL device 230). The ground layer 216 may have a plurality of openings, and the cathode interconnects 242 may extend through respective openings of the plurality of openings. Accordingly, an area of the ground layer 216 has an inverse relationship with the quantity of cathode interconnects 242. Thus, decreasing the quantity of cathode interconnects 242 increases the area of the ground layer 216, thereby reducing inductance.

One or more first cathode interconnects 242 may be connected to the first electrode finger 240*a*, and one or more second cathode interconnects 242 may be connected to the second electrode finger 240*b*. The carrier 210 may include one or more traces 244 (e.g., jumpers). For example, the redistribution layer(s) 214 may include the traces 244. The first cathode interconnect(s) 242 may be bridged to the second cathode interconnect(s) 242 by the one or more traces 244. That is, the traces 244 are bridge elements that electrically connect the first electrode finger 240*a* and the second electrode finger 240*b*. For example, the traces 244 may electrically connect the first electrode finger 240*a* and the second electrode finger 240*b* by crossing the electrode finger of the cathode electrode 241 that is interdigitated between the first electrode finger 240*a* and the second electrode finger 240*b*. The traces 244 may be disposed on the redistribution layer(s) 214 or located between layers of (e.g., embedded in) the redistribution layer(s) 214.

In some implementations, the ground layer 216 may be integrated into the VCSEL device 230, electrically isolated from the anode layer 236 and the cathode electrodes 240, 241 of the VCSEL device 230. Here, the ground layer 216 may provide a current looping path near to, but in an opposite direction to, a driving current path through the anode layer 236. Accordingly, current flowing through the ground layer 216 may provide mutual inductance cancellation with current flowing through the anode layer 236 (e.g., when an isolation layer between the anode layer 236 and the ground layer 216 is sufficiently thin), thereby lowering inductance in the driving current path (e.g., a driving circuit external to the decoupling capacitor 220 starting from the contact 222*a*) through the anode layer 236.

The carrier substrate 212 (e.g., a driver chip) may include a switch (not shown) electrically connected to the cathode electrode 240. The carrier substrate 212 may be configured to provide driving signals to the switch to cause opening or closing of the switch. The switch may include a transistor, a field effect transistor (FET), a metal oxide semiconductor FET (MOSFET), or the like. Each cathode electrode of the VCSEL device 230 may be connected to a respective switch, or multiple cathode electrodes may be connected to a switch. Accordingly, a set of VCSELs 232 associated with the cathode electrode 240 may be controlled (e.g., turned on and turned off) via the switch connected to the cathode electrode 240.

Closing the switch may cause the decoupling capacitor 220 to discharge current (e.g., an anode signal) that flows from the contact 222*a* of the decoupling capacitor 220 through the carrier 210 (e.g., through an anode signal plane of the carrier 210), and from the carrier 210 through the anode layer 236 via one or more of the anode interconnects 238. From the anode layer 236, current may flow through one or more VCSELs 232 to the cathode electrode 240, and from the cathode electrode 240 to the carrier 210 via one or more of the cathode interconnects 242 and one or more of the traces 244. Current returning from the carrier 210 (e.g., a ground return signal) may flow through the ground layer 216 to the ground path 218, and then to the contact 222*b* (e.g., a ground contact) of the decoupling capacitor 220.

As indicated above, FIG. 3A is provided as an example. Other examples may differ from what is described with regard to FIG. 3A.

Figure 3B:
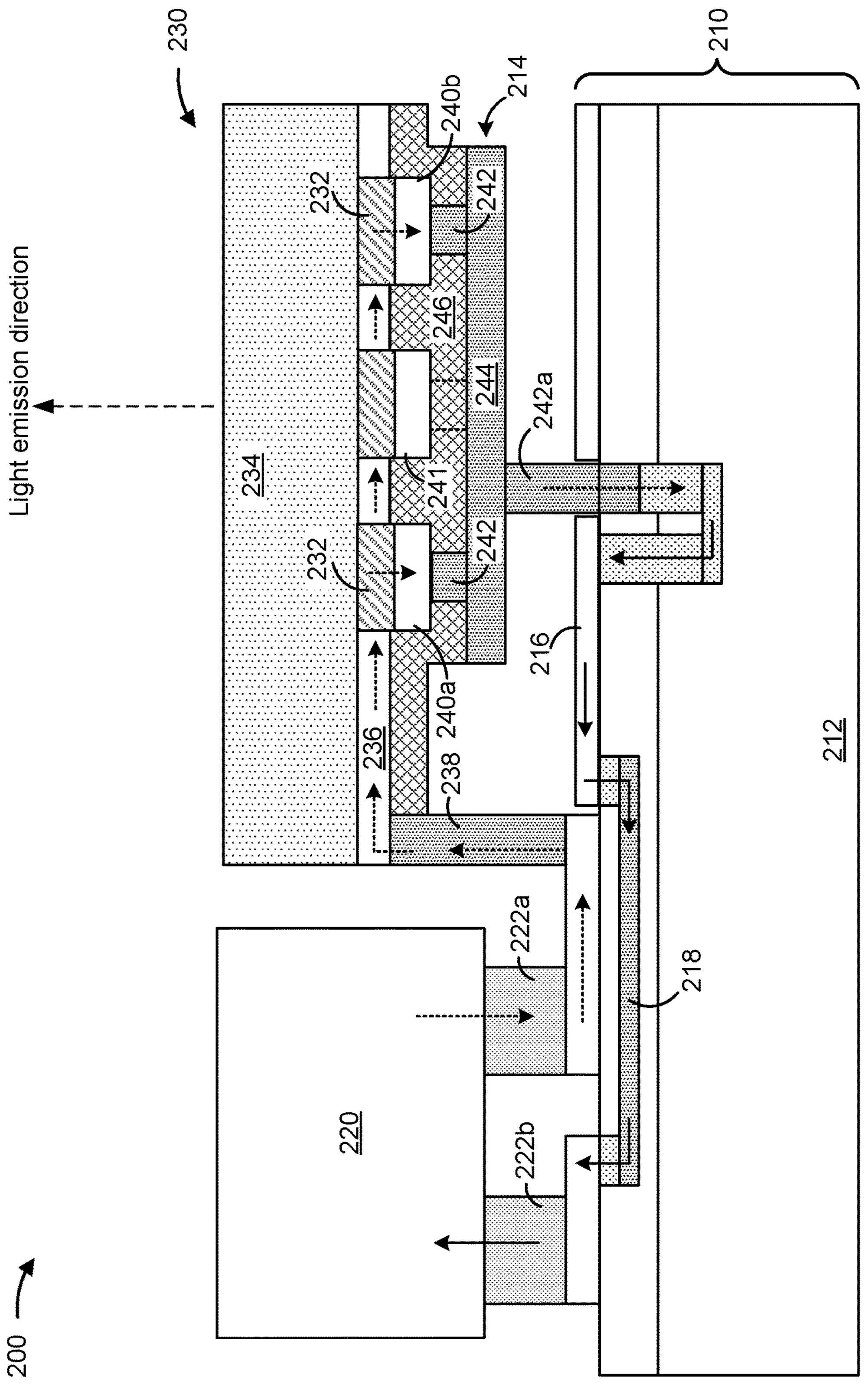

FIG. 3B is a diagram illustrating a simplified cross-sectional view of the example emitter assembly 200 of FIG. 2 taken along line A-A. The example of FIG. 3B is an alternative to the example of FIG. 3A.

As shown, the VCSEL device 230 may include an isolation layer 246. The isolation layer 246 may include a dielectric layer, which may include SiN, $Si_3N_4$, or $SiO_2$. The isolation layer 246 may be on the anode layer 236 and on the cathode electrodes 240 of the VCSEL device 230. As further shown, the VCSEL device 230 may include a trace 244 (e.g., of a redistribution layer 214) electrically connected to cathode interconnects 242 that are connected to the first electrode finger 240*a* and the second electrode finger 240*b*, thereby electrically connecting the first electrode finger 240*a* and the second electrode finger 240*b* of the cathode electrode 240. The trace may be a conductive pad, as described in FIG. 7. Moreover, the trace 244 may be electrically isolated from the cathode electrode 241 by the isolation layer 246. For example, the isolation layer 246 may have openings that allow the cathode interconnects 242 connected to the first electrode finger 240*a* and the second electrode finger 240*b* (e.g., associated with a same channel) to electrically connect to the trace 244 without providing an electrical connection to the cathode electrode 241 (e.g., associated with a different channel than the channel associated with the first electrode finger 240*a* and the second electrode finger 240*b*). In other words, the trace 244 is a bridge element that electrically connects the first electrode finger 240*a* and the second electrode finger 240*b* (e.g., by crossing the electrode finger of the cathode electrode 241 that is interdigitated between the first electrode finger 240*a* and the second electrode finger 240*b*).

As further shown, one or more common cathode interconnects 242*a* (e.g., common to the cathode interconnects 242 of the channel associated with the cathode electrode 240) may be electrically connected to the trace 244 and the carrier 210. The common cathode interconnect 242*a* may extend from the VCSEL device 230 to the carrier 210 and/or may extend from the carrier 210 to the VCSEL device 230.

As indicated above, FIG. 3B is provided as an example. Other examples may differ from what is described with regard to FIG. 3B.

Figure 3C:
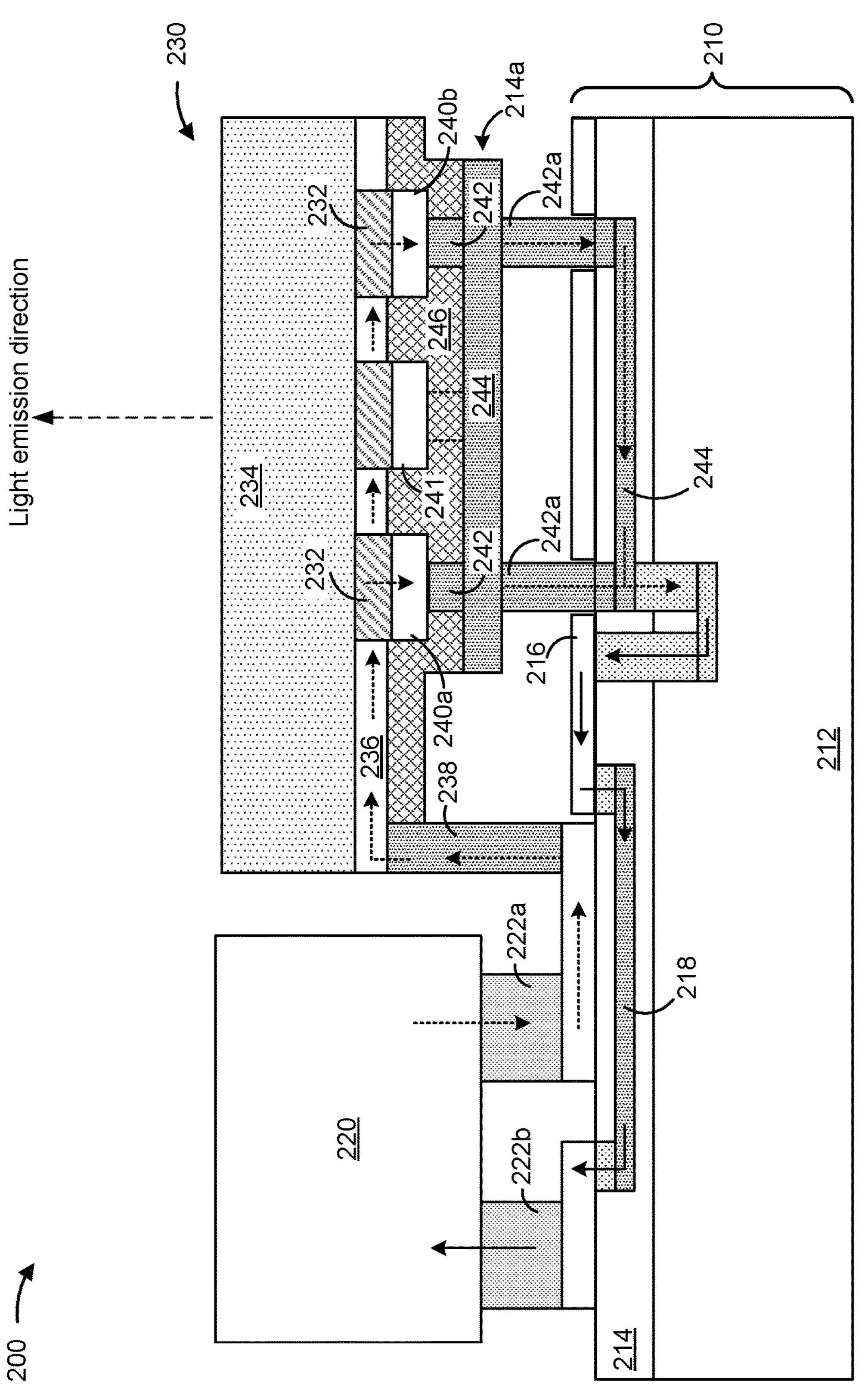

FIG. 3C is a diagram illustrating a simplified cross-sectional view of the example emitter assembly 200 of FIG. 2 taken along line A-A. The example of FIG. 3C is an alternative to the example of FIG. 3A.

As shown, the VCSEL device 230 may include an isolation layer 246, as described herein. As further shown, the VCSEL device 230 may include a trace 244 (e.g., of a redistribution layer 214*a*) electrically connected to cathode interconnects 242 that are connected to the first electrode finger 240*a* and the second electrode finger 240*b*, thereby electrically connecting the first electrode finger 240*a* and the second electrode finger 240*b* of the cathode electrode 240. The trace may be a conductive pad, as described in FIG. 7. Moreover, the trace 244 may be electrically isolated from the cathode electrode 241 by the isolation layer 246, as described herein. Accordingly, the trace 244 is a bridge element that electrically connects the first electrode finger 240*a* and the second electrode finger 240*b* (e.g., by crossing the electrode finger of the cathode electrode 241 that is interdigitated between the first electrode finger 240*a* and the second electrode finger 240*b*).

As further shown, multiple common cathode interconnects 242*a* (e.g., common to the cathode interconnects 242 of the channel associated with the cathode electrode 240) may be electrically connected to the trace 244 and the carrier 210. For example, a first common cathode interconnect 242*a* may be in alignment with a cathode interconnect 242 connected to the first electrode finger 240*a* and a second common cathode interconnect 242*a* may be in alignment with a cathode interconnect 242 connected to the second electrode finger 240*b*. The common cathode interconnects 242*a* may extend from the VCSEL device 230 to the carrier 210 and/or may extend from the carrier 210 to the VCSEL device 230. The trace 244 of the redistribution layer 214*a* may be in addition to the trace 244 of the redistribution layer 214, described herein. For example, the trace 244 of the redistribution layer 214*a* may bridge the cathode interconnects 242, and the trace 244 of the redistribution layer 214 may bridge the common cathode interconnects 242*a*. In other words, one or more bridge elements, as described herein, may be in the carrier 210 (e.g., in the redistribution layer 214 of the carrier 210) and/or may be in the VCSEL device 230 (e.g., in the redistribution layer 214*a* of the VCSEL device 230). In this way, a resistance and/or an inductance of the bridge elements may be reduced, a complexity of bridging sections in the VCSEL device 230 may have reduced complexity, and/or a greater variety of bridging patterns may be used.

As indicated above, FIG. 3C is provided as an example. Other examples may differ from what is described with regard to FIG. 3C.

FIG. 4 is a diagram illustrating an example VCSEL device 230. As shown, the first electrode finger 240*a* and the second electrode finger 240*b* of the cathode electrode 240 may be arranged interdigitally with a first electrode finger 241*a* and a second electrode finger 241*b* of the cathode electrode 241. As described above, non-interdigitated configurations may alternatively be used. In FIG. 4, two cathode electrodes of the VCSEL device 230 are shown. However, the VCSEL device 230 may include more than two cathode electrodes. For example, each row of VCSELs 232 of the VCSEL device 230 may be connected to an electrode finger of a cathode electrode.

FIG. 4 also shows how the traces 244 (shown in dashed line) connect to the cathode interconnects 242 of the VCSEL device 230. As shown, multiple traces 244 may bridge the cathode interconnects 242 connected to the cathode electrode 240. Specifically, each of the multiple traces 244 bridges (e.g., over the cathode electrode 241) one of the first cathode interconnects 242, connected to the first electrode finger 240*a*, with one of the second cathode interconnects 242 connected to the second electrode finger 240*b*. A similar scheme may also be used with respect to the cathode electrode 241, as shown. In some implementations, a trace 244 may be linear (e.g., straight), as shown. Alternatively, a trace 244 may be non-linear (e.g., may have one or more bends) to increase a length of the trace 244 (e.g., to reduce electromigration and/or electron momentum transfer).

As indicated above, FIG. 4 is provided as an example. Other examples may differ from what is described with regard to FIG. 4. For example, the quantity of cathode interconnects 242 and traces 244 per cathode electrode shown in FIG. 4 is an example, and a greater or a lesser quantity of cathode interconnects 242 and traces 244 per cathode electrode may be used.

FIG. 5 is a diagram illustrating an example VCSEL device 230. As shown, the first electrode finger 240*a* and the second electrode finger 240*b* of the cathode electrode 240 may be arranged interdigitally with a first electrode finger 241*a* and a second electrode finger 241*b* of the cathode electrode 241. As described above, non-interdigitated configurations may alternatively be used. In FIG. 5, two cathode electrodes of the VCSEL device 230 are shown. However, the VCSEL device 230 may include more than two cathode electrodes. For example, each row of VCSELs 232 of the VCSEL device 230 may be connected to an electrode finger of a cathode electrode.

FIG. 5 also shows how the traces 244 (shown in dashed line) connect to the cathode interconnects 242 of the VCSEL device 230. As shown, a single trace 244 may bridge the cathode interconnects 242 connected to the cathode electrode 240. Specifically, the trace 244 may have a main trace portion 244*a* that is linear and one or more (e.g., multiple) trace extensions 244*b* that extend (e.g., orthogonally) from the main trace portion 244*a*. Moreover, the trace extensions

244*b* may bridge the first cathode interconnects 242, connected to the first electrode finger 240*a*, with the second cathode interconnects 242 connected to the second electrode finger 240*b*. For example, each of the trace extensions 244*b* may bridge (e.g., over the cathode electrode 241) one of the first cathode interconnects 242 with one of the second cathode interconnects 242. A similar scheme may also be used with respect to the cathode electrode 241, as shown. In some implementations, a trace extension 244*b* may be linear (e.g., straight), may be non-linear (e.g., may have one or more bends), and/or may extend from the main trace portion 244*a* at some angle other than orthogonal.

As indicated above, FIG. 5 is provided as an example. Other examples may differ from what is described with regard to FIG. 5. For example, the quantity of cathode interconnects 242 and traces 244 per cathode electrode shown in FIG. 5 is an example, and a greater or a lesser quantity of cathode interconnects 242 and traces 244 per cathode electrode may be used.

FIG. 6 is a diagram illustrating an example VCSEL device 230. As shown, the first electrode finger 240*a* and the second electrode finger 240*b* of the cathode electrode 240 may be arranged interdigitally with a first electrode finger 241*a* and a second electrode finger 241*b* of the cathode electrode 241. As described above, non-interdigitated configurations may alternatively be used. In FIG. 6, two cathode electrodes of the VCSEL device 230 are shown. However, the VCSEL device 230 may include more than two cathode electrodes. For example, each row of VCSELs 232 of the VCSEL device 230 may be connected to an electrode finger of a cathode electrode.

FIG. 6 also shows how the traces 244 (shown in dashed line) connect to the cathode interconnects 242 of the VCSEL device 230. As shown, a single trace 244 may bridge the cathode interconnects 242 connected to the cathode electrode 240. Specifically, the trace 244 may have a main trace portion 244*a* that is linear and one or more (e.g., multiple) trace extensions 244*b* that extend from the main trace portion 244*a*. Moreover, the trace extensions 244*b* may bridge the first cathode interconnects 242, connected to the first electrode finger 240*a*, with the second cathode interconnects 242 connected to the second electrode finger 240*b*. For example, a single trace extension 244*b* may bridge (e.g., over the cathode electrode 241) one of the first cathode interconnects 242 with at least two of the second cathode interconnects 242. A similar scheme may also be used with respect to the cathode electrode 241, as shown. In some implementations, a trace extension 244*b* may be linear (e.g., straight), may be non-linear (e.g., may have one or more bends), and/or may extend from the main trace portion 244*a* at some angle other than orthogonal. For example, a trace extension 244*b* that bridges one of the first cathode interconnects 242 with one of the second cathode interconnects 242 may be linear, and a trace extension 244*b* that bridges one of the first cathode interconnects 242 with at least two of the second cathode interconnects 242 may be non-linear.

As indicated above, FIG. 6 is provided as an example. Other examples may differ from what is described with regard to FIG. 6. For example, the quantity of cathode interconnects 242 and traces 244 per cathode electrode shown in FIG. 6 is an example, and a greater or a lesser quantity of cathode interconnects 242 and traces 244 per cathode electrode may be used.

Figure 7:
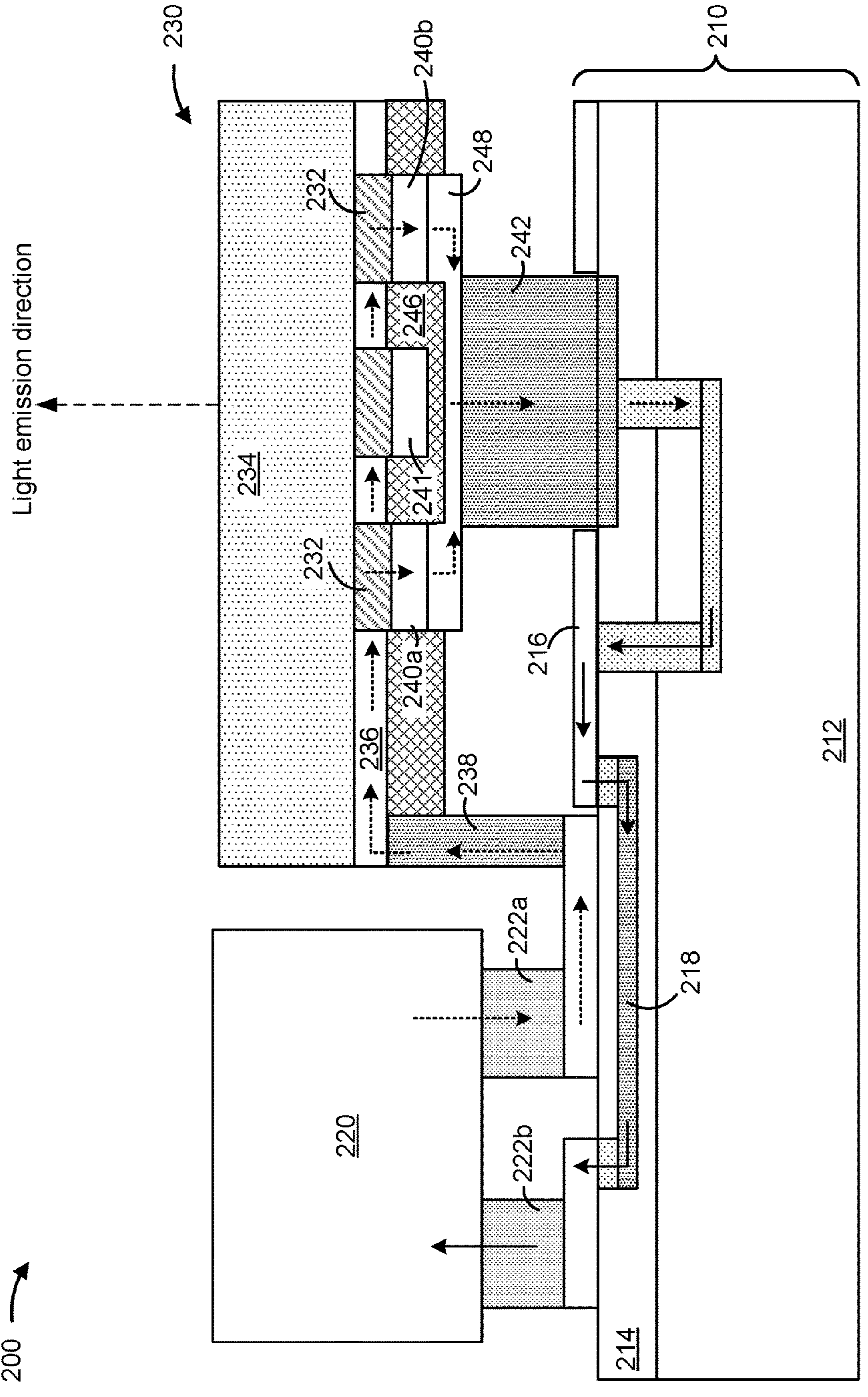
FIG. 7 is a diagram illustrating a simplified cross-sectional view of the example emitter assembly of FIG. 2 taken along line A-A.

FIG. 7 is a diagram illustrating a simplified cross-sectional view of the example emitter assembly 200 of FIG. 2 taken along line A-A. The example of FIG. 7 is an alternative to the examples of FIGS. 3A-3C. In particular, the example of FIG. 7 relates to a "super interconnect" design in which wider (e.g., greater diameter) cathode interconnects 242 are used, relative to the examples of FIGS. 3A-3C.

As shown, the VCSEL device 230 may include an isolation layer 246, as described herein. As further shown, the VCSEL device 230 may include a conductive pad 248. The conductive pad 248 may include a metal pad. The conductive pad 248 may be on the isolation layer 246 and may electrically connect the first electrode finger 240*a* and the second electrode finger 240*b* of the cathode electrode 240. Moreover, the conductive pad 248 may be electrically isolated from the cathode electrode 241 by the isolation layer 246. For example, the isolation layer 246 may have openings that allow the conductive pad 248 to electrically connect to the first electrode finger 240*a* and the second electrode finger 240*b* (e.g., associated with a same channel) without connecting to the cathode electrode 241 (e.g., associated with a different channel than the channel associated with the first electrode finger 240*a* and the second electrode finger 240*b*). In other words, the conductive pad 248 is a bridge element that electrically connects the first electrode finger 240*a* and the second electrode finger 240*b* (e.g., by crossing the electrode finger of the cathode electrode 241 that is interdigitated between the first electrode finger 240*a* and the second electrode finger 240*b*).

A cathode interconnect 242 may be electrically connected to the conductive pad 248 (e.g., connected to the cathode electrode 240 via the conductive pad 248). A width (e.g., a diameter) of the cathode interconnect 242 may be greater than a width of the first electrode finger 240*a* and a width of the second electrode finger 240*b*. Accordingly, a width of the conductive pad 248 may be greater than the width of the first electrode finger 240*a* and the width of the second electrode finger 240*b*, and/or a length of the conductive pad 248 (e.g., a dimension perpendicular to the width of the conductive pad 248) may be greater than the width of the first electrode finger 240*a* and the width of the second electrode finger 240*b*.

This wider cathode interconnect 242 may facilitate simpler connection between the VCSEL device 230 and the carrier 210, may simplify routing at the redistribution layer(s) 214, and/or may improve a reliability and a useful life of the emitter assembly 200.

As indicated above, FIG. 7 is provided as an example. Other examples may differ from what is described with regard to FIG. 7.

Figure 8:
FIG. 8 is a diagram illustrating an example VCSEL device.
Figure 8:
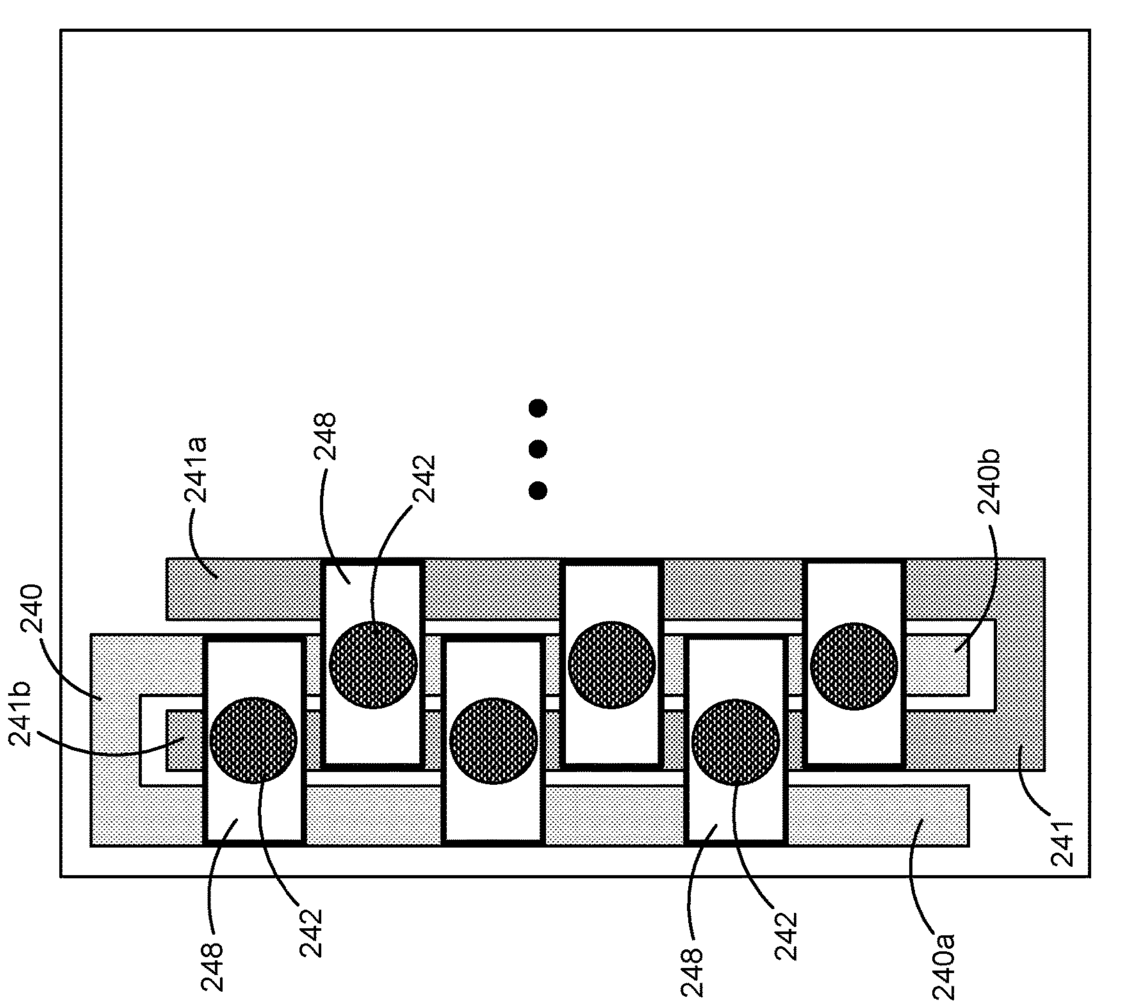

FIG. 8 is a diagram illustrating an example VCSEL device 230. For example, in FIG. 8, the VCSEL device 230 may employ "super interconnects," as described in connection with FIG. 7. As shown, the first electrode finger 240*a* and the second electrode finger 240*b* of the cathode electrode 240 may be arranged interdigitally with a first electrode finger 241*a* and a second electrode finger 241*b* of the cathode electrode 241. As described above, non-interdigitated configurations may alternatively be used. In FIG. 8, two cathode electrodes of the VCSEL device 230 are shown. However, the VCSEL device 230 may include more than two cathode electrodes. For example, each row of VCSELs 232 of the VCSEL device 230 may be connected to an electrode finger of a cathode electrode.

As shown, the VCSEL device 230 may include a plurality of conductive pads 248 that bridge the first electrode finger 240*a* and the second electrode finger 240*b* at various locations along the first electrode finger 240*a* and the second electrode finger 240*b*, in a similar manner as described above. Moreover, as shown, a respective cathode interconnect 242 may be connected to each conductive pad 248, in a similar manner as described above. A similar scheme may also be used with respect to the cathode electrode 241, as shown.

As indicated above, FIG. 8 is provided as an example. Other examples may differ from what is described with regard to FIG. 8. For example, the quantity of cathode interconnects 242 and conductive pads 248 per cathode electrode shown in FIG. 8 is an example, and a greater or a lesser quantity of cathode interconnects 242 and conductive pads 248 per cathode electrode may be used.

In some implementations, an optical source may include the emitter assembly 200 and/or the VCSEL device 230. In some implementations, an optical system may include the emitter assembly 200 and/or the VCSEL device 230. Moreover, the optical system may include one or more lenses, one or more optical elements (e.g., diffractive optical elements, refractive optical elements, or the like), one or more reflector elements, and/or one or more optical sensors, among other examples. In some implementations, the emitter assembly 200 and/or the VCSEL device 230 may be included in (e.g., may be configured for use in) a lidar system or a three-dimensional sensing system.

According to some implementations, a method may include generating an optical pulse for lidar using the emitter assembly 200 and/or the VCSEL device 230; receiving a signal based on a reflection of the optical pulse from an object; and/or determining a distance and/or a velocity of the object based on the signal. According to some implementations, a method may include generating (or forming) an array of light spots for three-dimensional sensing using the emitter assembly 200 and/or the VCSEL device 230; receiving signals based on reflection of the light spots from an object; and/or generating a depth map based on the signals. According to some implementations, a method may include generating (or forming) a light pattern for three-dimensional sensing using the emitter assembly 200 and/or the VCSEL device 230; receiving signals based on reflection of the light pattern from an object; and/or generating a depth map based on the signals.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," "bottom," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An emitter assembly, comprising:

a carrier comprising a carrier substrate;

a vertical cavity surface emitting laser (VCSEL) device, on the carrier, comprising:

a substrate;

a plurality of VCSELs on the substrate;

at least one anode layer on the substrate and electrically connected to the plurality of VCSELs;

one or more anode interconnects that electrically connect the at least one anode layer and the carrier;

a cathode electrode over at least a portion of multiple VCSELs, of the plurality of VCSELs, and electrically connected to the multiple VCSELs, the cathode electrode comprising multiple cathode electrode fingers; and one or more cathode interconnects that electrically connect the cathode electrode and the carrier, the one or more cathode interconnects comprising one or more first interconnects connected to a first finger of the multiple cathode electrode fingers of the cathode electrode and one or more second interconnects connected to a second finger of the multiple cathode electrode fingers of the cathode electrode; and one or more redistribution layers comprising one or more traces, the one or more first interconnects being bridged to the one or more second interconnects by the one or more traces of the one or more redistribution layers.

2. The emitter assembly of claim 1, wherein the one or more traces comprise multiple traces, and wherein each of the multiple traces bridges one of the one or more first interconnects with one of the one or more second interconnects.

3. The emitter assembly of claim 1, wherein the one or more traces comprise a single trace having a main trace portion that is linear and one or more trace extensions that extend from the main trace portion, and wherein the one or more trace extensions bridge the one or more first interconnects with the one or more second interconnects.

4. The emitter assembly of claim 3, wherein the one or more trace extensions comprise multiple trace extensions, and wherein each of the multiple trace extensions bridges one of the one or more first interconnects with one of the one or more second interconnects.

5. The emitter assembly of claim 3, wherein the one or more trace extensions comprise a trace extension that bridges one of the one or more first interconnects with at least two of the one or more second interconnects.

6. The emitter assembly of claim 1, wherein the one or more redistribution layers are on the VCSEL device.

7. The emitter assembly of claim 1, wherein the one or more redistribution layers are on the carrier substrate.

8. The emitter assembly of claim 1, wherein the multiple cathode electrode fingers are arranged interdigitally with cathode electrode fingers of an additional cathode electrode of the VCSEL device.

9. An emitter assembly, comprising:

a carrier comprising a carrier substrate;

a vertical cavity surface emitting laser (VCSEL) device, on the carrier, comprising:

a substrate;

a plurality of VCSELs on the substrate;

at least one anode layer on the substrate and electrically connected to the plurality of VCSELs;

a cathode electrode over at least a portion of multiple VCSELs, of the plurality of VCSELs, and electrically connected to the multiple VCSELs, the cathode electrode comprising multiple cathode electrode fingers; and a bridge element that electrically connects a first finger of the multiple cathode electrode fingers and a second finger of the multiple cathode electrode fingers.

10. The emitter assembly of claim 9, further comprising:

an isolation layer on the cathode electrode, wherein the bridge element includes a conductive pad, on the isolation layer, electrically connecting the first finger and the second finger, and isolated from a cathode electrode finger of an additional cathode electrode by the isolation layer.

11. The emitter assembly of claim 10, further comprising:

a cathode interconnect electrically connected to the conductive pad, wherein a width of the cathode interconnect is greater than a width of the first finger or a width of the second finger.

12. The emitter assembly of claim 9, further comprising:

one or more cathode interconnects, that electrically connect the cathode electrode and the carrier, comprising one or more first interconnects connected to the first finger and one or more second interconnects connected to the second finger, wherein the bridge element includes one or more traces of one or more redistribution layers that bridge the one or more first interconnects with the one or more second interconnects.

13. The emitter assembly of claim 9, wherein the multiple cathode electrode fingers are arranged interdigitally with cathode electrode fingers of an additional cathode electrode of the VCSEL device.

14. The emitter assembly of claim 13, wherein the bridge element electrically connects the first finger of the multiple cathode electrode fingers and the second finger of the multiple cathode electrode fingers by crossing an electrode finger of the additional cathode electrode that is interdigitated between the first finger and the second finger.

15. The emitter assembly of claim 9, wherein the carrier further comprises a ground layer, and wherein the emitter assembly further comprises a decoupling capacitor electrically connected to the ground layer.

16. An emitter assembly, comprising:

a vertical cavity surface emitting laser (VCSEL) device, comprising:

a substrate;

a plurality of VCSELs on the substrate;

at least one anode layer on the substrate and electrically connected to the plurality of VCSELs;

a cathode electrode over at least a portion of multiple VCSELs, of the plurality of VCSELs, and electrically connected to the multiple VCSELs, the cathode electrode comprising multiple cathode electrode fingers; and a bridge element that electrically connects a first finger of the multiple cathode electrode fingers and a second finger of the multiple cathode electrode fingers.

17. The emitter assembly of claim 16, further comprising:

an isolation layer on the cathode electrode, wherein the bridge element includes a conductive pad, on the isolation layer, electrically connecting the first finger and the second finger, and isolated from a cathode electrode finger of an additional cathode electrode by the isolation layer; and a cathode interconnect electrically connected to the conductive pad, wherein a width of the cathode interconnect is greater than a width of the first finger or a width of the second finger.

18. The emitter assembly of claim 16, further comprising:

one or more cathode interconnects comprising one or more first interconnects connected to the first finger and one or more second interconnects connected to the second finger, wherein the bridge element includes one or more traces of one or more redistribution layers that bridge the one or more first interconnects with the one or more second interconnects.

19. The emitter assembly of claim 18, wherein the one or more traces comprise multiple traces, and wherein each of the multiple traces bridges one of the one or more first interconnects with one of the one or more second interconnects.

20. The emitter assembly of claim 16, wherein the multiple cathode electrode fingers are arranged interdigitally with cathode electrode fingers of an additional cathode electrode of the VCSEL device.

* * * * *